United States Patent
Hsiao et al.

(10) Patent No.: US 8,426,256 B2
(45) Date of Patent: Apr. 23, 2013

(54) METHOD OF FORMING STACKED-DIE PACKAGES

(75) Inventors: C. W. Hsiao, Banqiao (TW); Bo-I Lee, Sindian (TW); Tsung-Ding Wang, Tainan (TW); Kai-Ming Ching, Jhudong Township (TW); Chen-Shien Chen, Zhubei (TW); Chien-Hsiun Lee, Hsinchu (TW); Clinton Chao, Redwood Shores, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 364 days.

(21) Appl. No.: 12/700,929

(22) Filed: Feb. 5, 2010

(65) Prior Publication Data

US 2010/0279463 A1     Nov. 4, 2010

Related U.S. Application Data

(60) Provisional application No. 61/162,094, filed on Mar. 20, 2009.

(51) Int. Cl.
*H01L 21/00*     (2006.01)

(52) U.S. Cl.
USPC ............... 438/126; 438/127; 257/E21.502

(58) Field of Classification Search .......... 438/124, 438/126, 127; 257/E21.502
See application file for complete search history.

(56) References Cited

U.S. PATENT DOCUMENTS
2010/0033799 A1* 2/2010 Pan et al. ............... 359/291

* cited by examiner

*Primary Examiner* — Julio J Maldonado
*Assistant Examiner* — Amar Movva
(74) *Attorney, Agent, or Firm* — Lowe Hauptman Ham & Berner, LLP

(57) ABSTRACT

A method of forming a stacked die structure is disclosed. A plurality of dies are respectively bonded to a plurality of semiconductor chips on a first surface of a wafer. An encapsulation structure is formed over the plurality of dies and the first surface of the wafer. The encapsulation structure covers a central portion of the first surface of the wafer and leaves an edge portion of the wafer exposed. A protective material is formed over the first surface of the edge portion of the wafer.

20 Claims, 16 Drawing Sheets

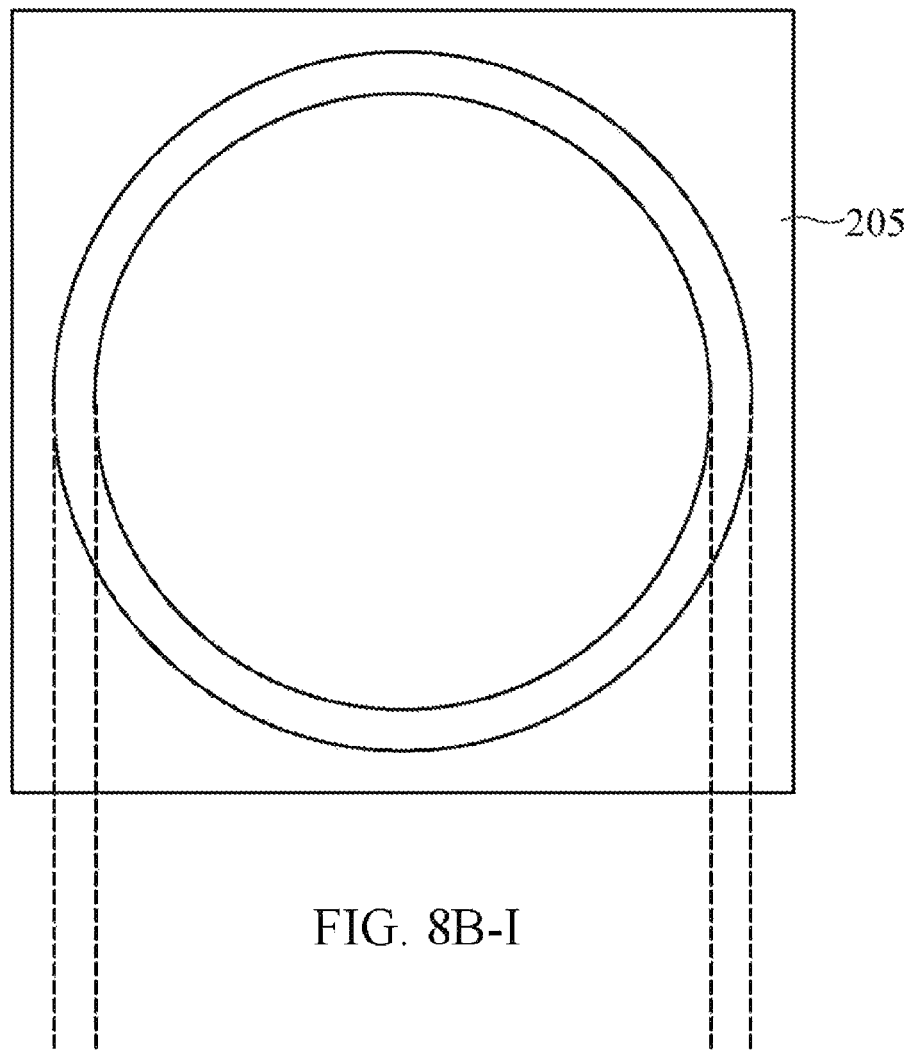
FIG. 8B-I
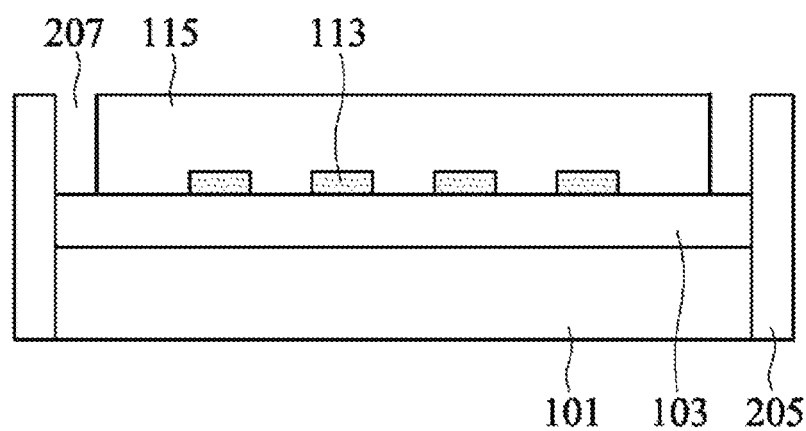
FIG. 8B-II

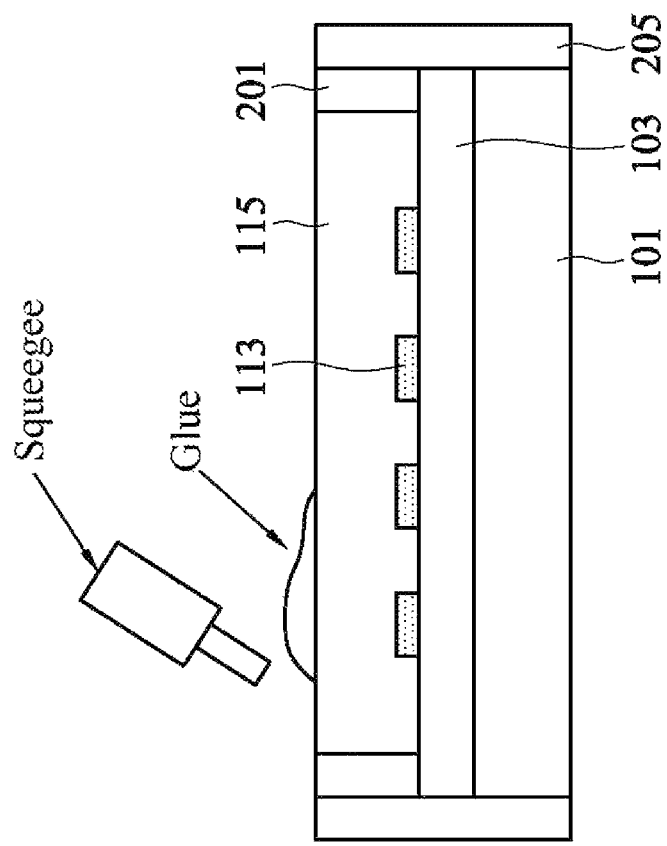
FIG. 8B-III

METHOD OF FORMING STACKED-DIE PACKAGES

CROSS-REFERENCE TO RELATED APPLICATIONS

The present application claims priority of U.S. Application Ser. No. 61/162,094 filed on Mar. 20, 2009, which is incorporated herein by reference in its entirety.

TECHNICAL FIELD

This disclosure relates generally to integrated circuit manufacturing processes, and more particularly to methods of forming stacked-die packages.

BACKGROUND

Integrated circuits are commonly used to make a wide variety of electronic devices, such as memory chips. There is a strong desire to reduce the size of integrated circuits, as well as to increase the density of individual semiconductor components and consequently enhance the functionality of an electronic device. In an effort to increase the density and functionality of a semiconductor component, attempts have been made to create three-dimensional integrated circuits (3D-ICs). Generally, 3D-ICs allow the integration of chips with different functions (e.g., processor, logic, ASIC, memory), offer low manufacturing costs, provide mechanically stable structures, and reduce circuit RC delay and power consumption.

Generally, 3D-ICs include a plurality of semiconductor dies stacked upon one another. In a typical 3D-IC formation process, a plurality of diced, known good dies are selected and bonded to corresponding dies formed on a wafer. Each of the plurality of diced dies and each of corresponding dies formed on the wafer is electrically connected through one or more through-silicon vias (TSV). The resulting stacked die could provide multiple functions or increased density for a single type of function. After the dies in a stack are physically and electrically connected, the stack is encapsulated by placing a molding compound over the plurality of diced dies and the top surface of the wafer. However, conventional technology does not allow the whole area of the top surface of the wafer to be covered with the molding component. Uncovered portions of the wafer are more likely to crack during wafer handling or a die-sawing process because the uncovered portions, which are typically along the edge of the wafer, are not mechanically supported by the molding compound.

Accordingly, there is a need for an improved method to create a stacked die configuration that avoids wafer edge cracking during a die saw process or wafer handling with improved robustness.

SUMMARY

An embodiment of the invention comprises a method of forming a plurality stacked dies on a wafer. A wafer having a first surface and a second surface is provided, and the wafer comprises a plurality of semiconductor chips on the first surface. A plurality of dies are respectively bonded to the plurality of semiconductor chips on the first surface. An encapsulation structure is formed over the plurality of dies and the first surface of the wafer. The encapsulation structure covers a central portion of the first surface of the wafer and leaves an edge portion of the wafer exposed. The edge portion of the wafer is removed so that the distance between the edge of the encapsulation structure and the edge of the remaining portion of the wafer is less than 0.5 mm.

Another embodiment of the invention comprises a method of forming a plurality of stacked dies on a wafer. A wafer having a first surface and a second surface is provided, and the wafer comprises a plurality of semiconductor chips on the first surface. A plurality of dies are respectively bonded to the plurality of semiconductor chips on the first surface. An encapsulation structure is formed over the plurality of dies and the first surface of the wafer. The encapsulation structure covers a central portion of the first surface of the wafer and leaves an edge portion of the wafer exposed. A protective material is formed over the first surface of the edge portion of the wafer.

Yet another embodiment of the invention comprises forming a semiconductor component with a stacked die structure. A wafer having a first surface and a second surface is provided, and the wafer comprises a plurality of semiconductor chips on the first surface. A plurality of dies are respectively bond to the plurality of semiconductor chips on the first surface. Each one of the plurality of dies is electrically connected to one of the plurality of the semiconductor chips through a through-silicon via. An encapsulation structure is formed over the plurality of dies and a central portion the first surface of the wafer to form a package structure, and an edge portion of the wafer is exposed. A protective material is formed over the first surface of the edge portion of the wafer. Then, the package structure is sawed to separate the semiconductor components.

One of the advantageous features of the present invention is the reduction of wafer edge cracks and breaks that occur during wafer handling and die saw process. The yield of the packing process is thus significantly increased.

BRIEF DESCRIPTION OF THE DRAWINGS

The present disclosure will be described with reference to embodiments thereof as illustrated in the accompanying drawings. It should be understood that the drawings for illustrative purposes and therefore not drawn to scale.

FIGS. 8BI-8BIII are cross-sectional views and a top view of an alternative method of adding a protective material on the edge portion of the wafer.

DETAILED DESCRIPTION

The making and using of illustrative embodiments are discussed in detail below. It should be appreciated, however, that the present disclosure provides many applicable concepts that can be embodied in a wide variety of specific contexts. The specific embodiments discussed are merely illustrative, not restrictive.

FIGS. 1 to 7 depict a first embodiment of a method for forming stacked-die packages. FIG. 1A is a cross-sectional view of a wafer 103 including a plurality of semiconductor chips 100 attached onto a top surface of a carrier 101. Wafer 103 has a first surface 1001 on the first side of the wafer and a second surface 1002 on the second side of the wafer. The term "wafer" herein generally refers to a semiconductor substrate on which various layers and device structures are formed. In some embodiments, the wafer comprises silicon or compound semiconductor, such as GaAs, InP, Si/Ge, or SiC. Examples of such layers include dielectric layers, doped layers, and/or polysilicon layers. Examples of device structures include transistors, resistors, and/or capacitors, which may or may not be interconnected through an interconnect layer to additional active circuits. Generally, the carrier 101 provides temporary mechanical and structural support during subsequent processing steps. In one embodiment, the carrier 101 has a shape and a size in common with the wafer 103, so that the operation on the carrier 101 may be performed easily with existing equipment. Alternatively, in other embodiments, the carrier 101 has a shape and/or size different from those of the wafer 103. In some embodiments, the base material of the carrier 101 includes glass, silicon, silicon oxide, or other materials.

Figure 1A:
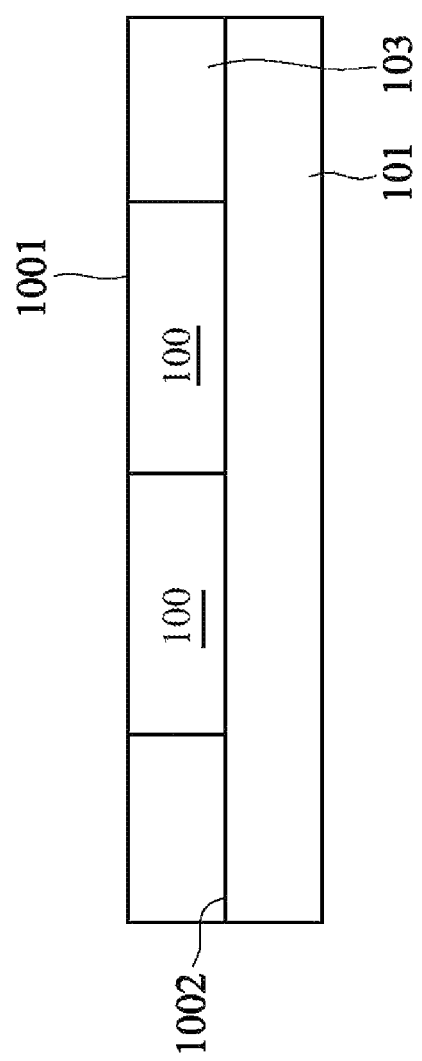
FIG. 1A is a cross-sectional view of a wafer attached to a carrier.
Figure 1B:
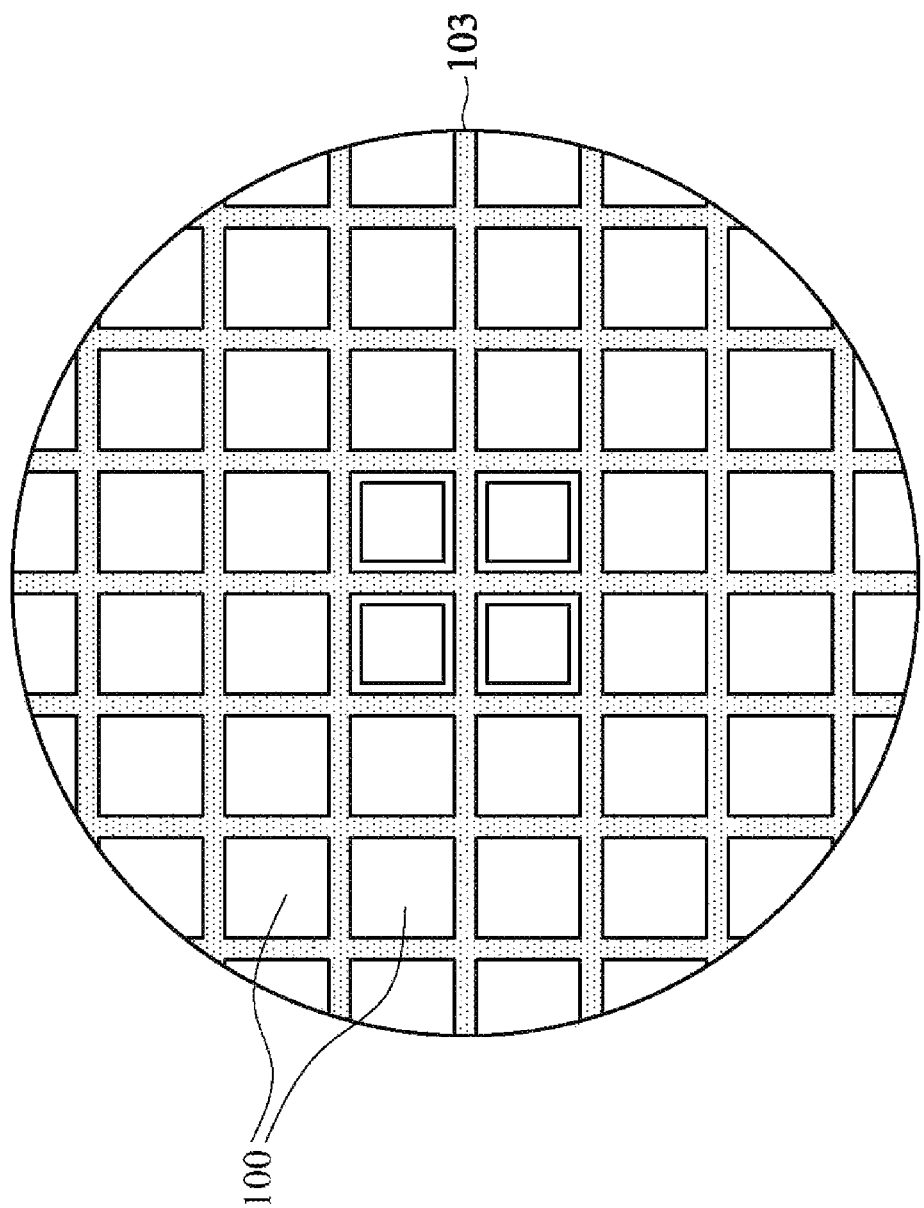
FIG. 1B is a top view of a surface of a wafer having a plurality of semiconductor chips fabricated thereon.

FIG. 1B shows the second surface 1002 of the wafer 103, which includes a plurality of semiconductor chips 100 fabricated on the wafer 103. The first surface 1001 and the second surface 1002 of the wafer 103 are also the first and the second surface of the respective semiconductor chips 100. In one embodiment, the wafer 103 is attached onto the carrier 101 by using an adhesive. The adhesive may be any suitable adhesive, such as ultraviolet (UV) glue or thermal curable glue. In some embodiments, the semiconductor chips 100 typically include various layers (not shown) and device structures (not shown) formed on the second surface 1002 of the wafer 103. The second surface 1002 of the wafer 103 is attached to a top surface of the carrier 101. The first surface 1001 opposite to the second surface 1002 is exposed.

Figure 2A:
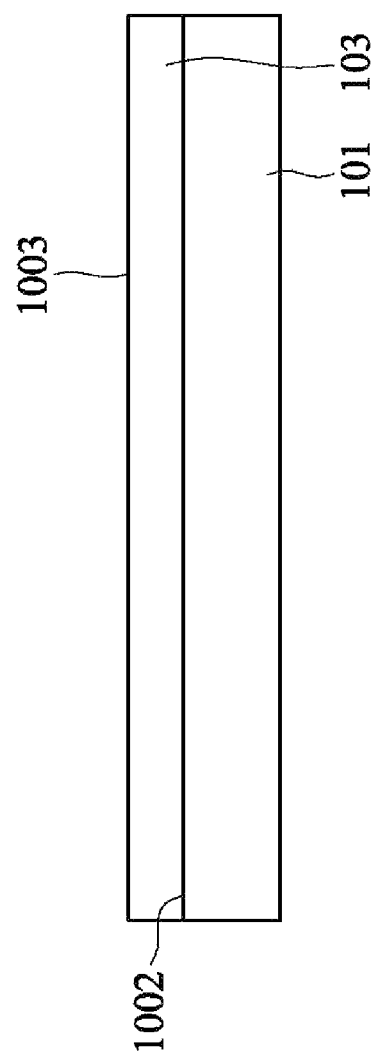
FIG. 2A is a cross-sectional view of the wafer of FIG. 1A after a thinning process is performed.

FIG. 2A is a cross-sectional view of wafer 103 and the carrier 101 from FIG. 1A after the wafer 103 has undergone a thinning process. The thinning process removes a portion of the wafer 103 from the first surface 1001 and defines a new first surface 1003. In some embodiments, the thinning process is performed using a mechanical grinding process, a chemical mechanical polishing (CMP) process, an etching process, and/or a combination thereof. The carrier 101 provides temporary mechanical and structural support to prevent wafer 103 from cracking and bending during this thinning process. In one embodiment, the wafer 103 is thinned to a predetermined thickness in a range of about 25 to about 250 micrometers (μm).

Figure 2B:
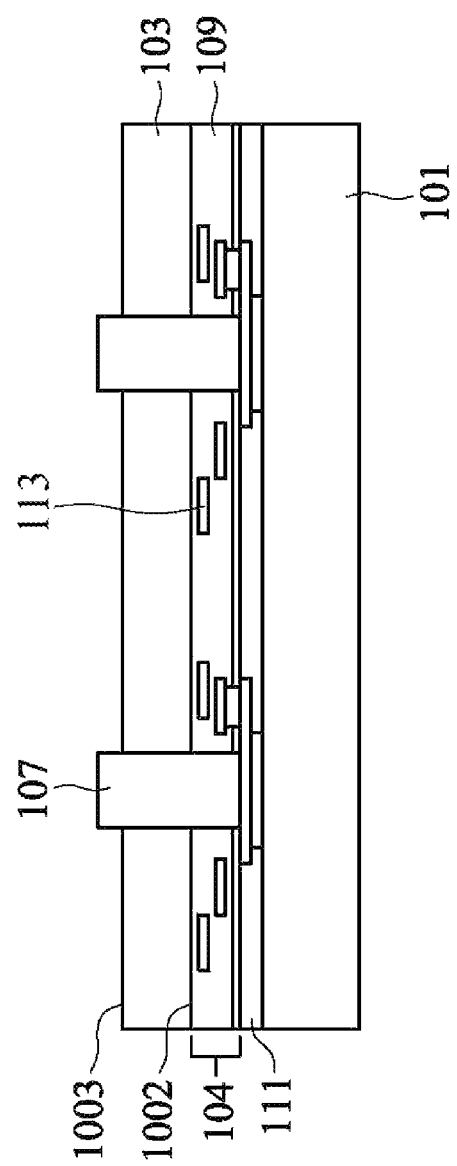
FIG. 2B is a magnified view of a portion of the wafer and the carrier in FIG. 2A.

FIG. 2B is an enlarged view of a portion of the wafer 103 and the carrier 101 depicted in FIG. 2A. In an embodiment, an interconnect layer 104 is formed over the second surface 1002 of the wafer 103. The interconnect layer 104 includes one or more layers of conductive layers 113 disposed within one or more layers of insulating layers 109. The interconnect layer 104 typically provides electrical connections to and between underlying device structure formed on the second surface 1002 of the wafer 103. An adhesive 111 is applied to attach the wafer 103 onto the carrier 101. Through-silicon vias (TSVs) 107 are formed at and extend through the wafer 103, and extend through insulating layers 109. In another embodiment, TSVs 107 extend through the wafer 103, but not through insulating layers 109. During the thinning process, in some embodiments, TSVs 107 are exposed. Thereafter, in some embodiments, a wet or dry etching process is performed to recess the wafer 103 to reveal a portion of the TSVs 107 and define the new first surface 1003. The TSVs 107 protrude from the new first surface 1003 of the wafer 103.

Figure 3A:
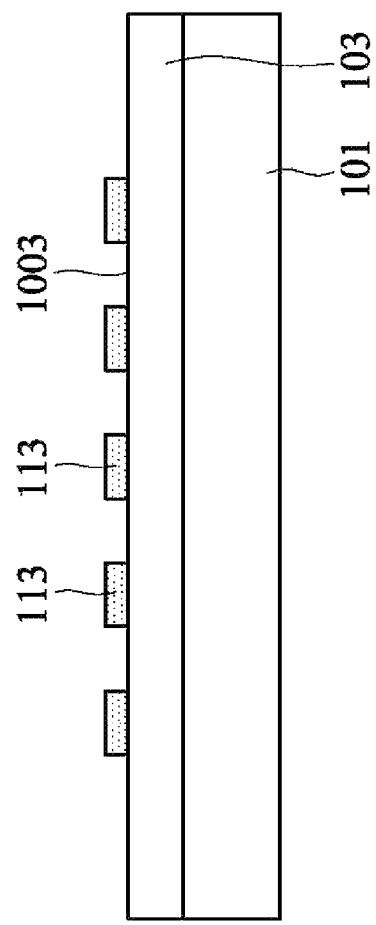
FIG. 3A is a cross-sectional view of a plurality of dies bonded onto the first surface of wafer of FIG. 2A.

Turning to FIG. 3A, a plurality of dies 113 are then bonded onto the new first surface 1003 of the semiconductor chips 100 of the wafer 103. The dies 113 and their respective semiconductor chips 100 of the wafer 103 become stacked dies. Each of the dies 113 is tested before it is bonded, and only "known-good-dies" are selected and bonded to the respective semiconductor chips 100 on the wafer 103. In an embodiment, each die 113 is bonded onto one semiconductor chip 100 on the wafer 103. Further, in some embodiments, other dies are placed on top of the dies 113. In some embodiments, dies 113 bonded onto the wafer 103 and the corresponding semiconductor chips 100 on the wafer 103 need not have the same circuit design and/or size. The bonding methods to form interconnection include commonly used methods such as oxide-to-oxide bonding, oxide-to-silicon bonding, copper-to-copper bonding, solder bonding, or the like.

Figure 3B:
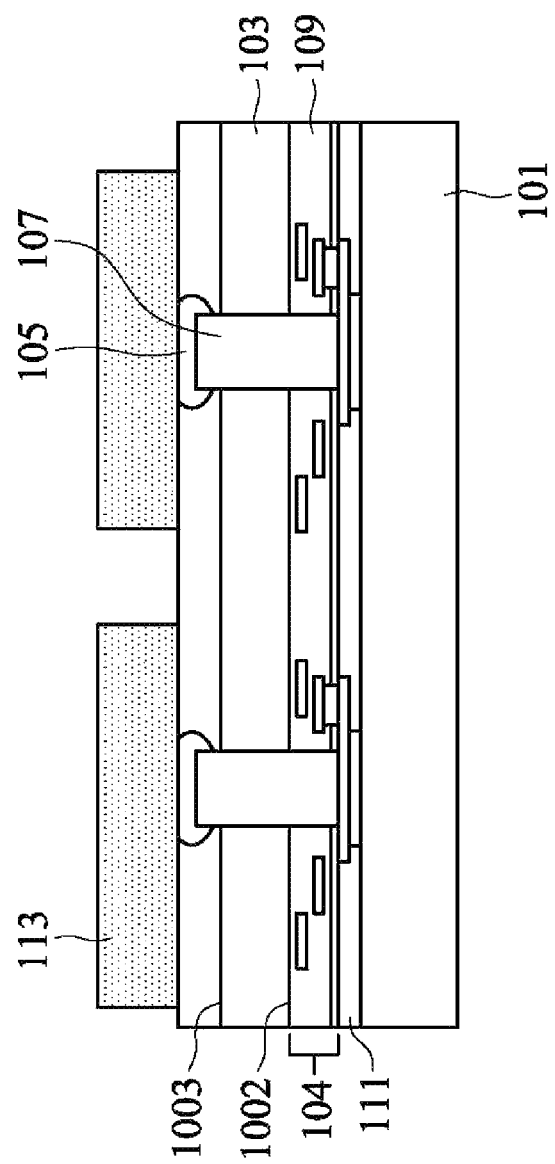
FIG. 3B is an enlarged view of a portion of dies, wafer, and carrier depicted in FIG. 3A having a plurality of dies bonded onto the first surface of the wafer.

FIG. 3B is an enlarged view of a portion of dies 113, wafer 103, and carrier 101 depicted in FIG. 3A. Dies 113 are placed and substantially aligned to TSVs 107 of the wafer 103 with solder 105 filled therebetween. Each of the dies 113 is electrically connected to one of the plurality of the semiconductor chips 100 on wafer 103 through one or more the TSVs 107. The stacked die could provide multiple functions or increased density for a single type of function because of the dies 113 and the semiconductor chip on wafer 103.

Figure 4:
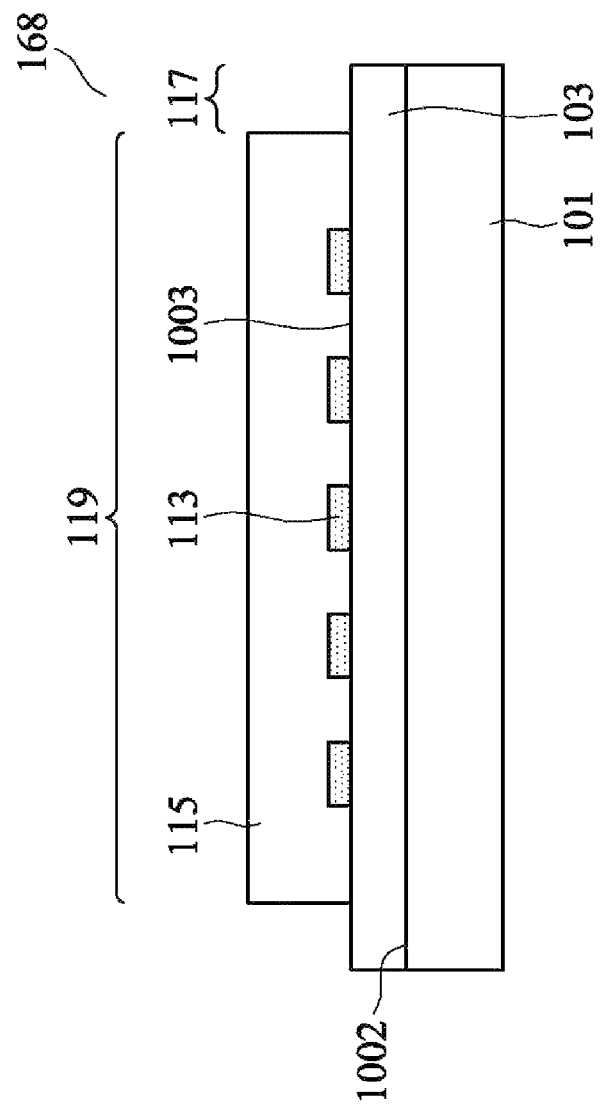
FIG. 4 is a cross-sectional view of an encapsulation structure formed over the plurality of dies and a central portion of the first surface of the wafer from FIG. 3A.

As FIG. 4 shows, an encapsulation structure 115 is formed over the plurality of dies 113 and a central portion 119 of the wafer 103 on the new first surface 1003 to form a package structure 168. The semiconductor chips 100 in the central portion 119 of the wafer 103 are also covered by the encapsulation structure 115. An edge portion 117 of the wafer 103 which is not covered by the encapsulation structure 115 is exposed. In some embodiments, the encapsulation structure 115 is a molding compound, including epoxies, silicon based polymer, polyimide, Poly-p-phenylene benzobisthiazole (PBO), or other commonly used materials. Preferably, the encapsulation structure 115 covers all dies 113 and flows into the gaps defined between dies 113 and the new first surface 1003 of the wafer 103. The encapsulation structure 115 preferably has a coefficient of thermal expansion (CTE) close to CTE of dies 113 and wafer 103.

Figure 5:
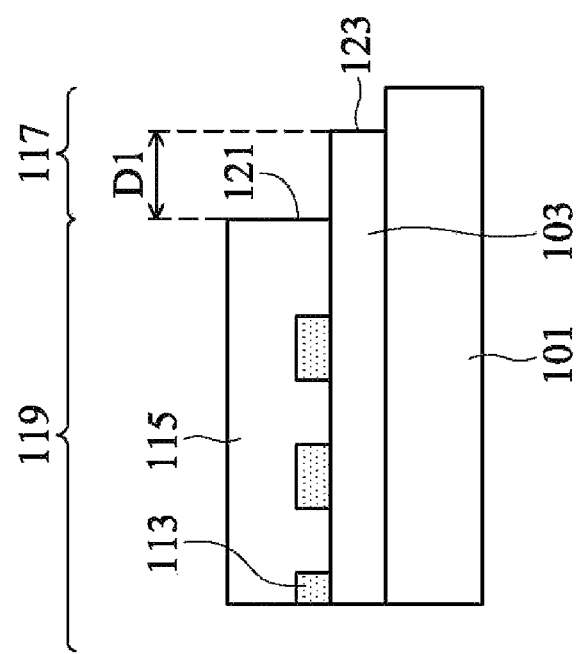
FIG. 5 is an enlarged view of a portion of the encapsulation structure and the wafer depicted in FIG. 4 having an edge portion of the wafer removed.

The next step in forming a stacked die is to remove a segment of the edge portion 117 of the wafer 103 not covered by the encapsulation structure 115. FIG. 5 is an enlarged view of a portion of the encapsulation structure and the wafer depicted in FIG. 4 after the segment of the edge portion 117 of the wafer 104 is removed, and a remaining portion of the wafer 103 is left. The removing methods include commonly used methods such as by photolithography and etching, or directly trimming the edge portion 117 of the wafer 103 using a laser sawing process or mechanical sawing process. The remaining portion of the wafer 103 includes the central portion 119 of the wafer 103 covered by the encapsulation structure 115, and the remaining segment of the edge portion 117 uncovered by the encapsulation structure 115. An edge 121 of the encapsulation structure 115 defines a first sidewall. An edge 123 of the remaining portion of the wafer 103 defines a second sidewall. Preferably, a distance D1 between the edge 121 of the encapsulation structure 115 and the edge 123 of remaining portion of the wafer is less than 0.5 millimeters (mm). In other words, the length of the uncovered edge portion 117 is less than 0.5 mm.

In some embodiments, the edge portion 117 of the wafer 103 uncovered by the encapsulation structure 115 is completely removed. As such, the first sidewall of the edge 121 and the second sidewall of the edge 123 are substantially aligned. Furthermore, the process of removing the edge portion 117 of the wafer 103 has the effect of reducing wafer edge cracked or broken during wafer handling and die sawing process, and crack, peeling or delamination is less likely to occur in weak layers, such as low dielectric constant layers.

Figure 6:
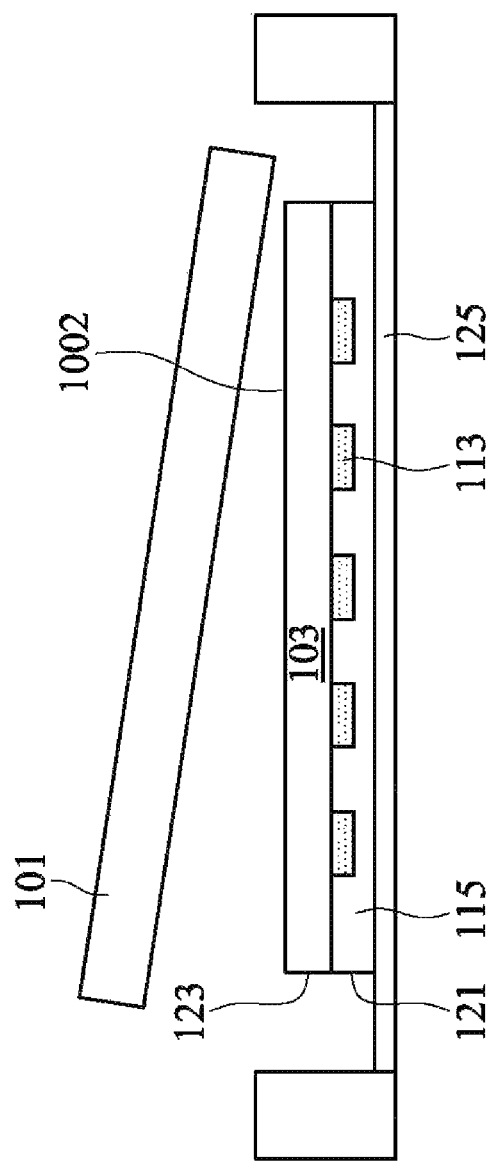
FIG. 6 is a cross-sectional view of the encapsulation structure of FIG. 5 after it is inverted and the top surface of the encapsulation structure is attached to a dicing tape.

Referring now to FIG. 6, the encapsulation structure 115 is inverted and the top surface of the encapsulation structure 115 is attached to a dicing tape 125. The carrier 101 is removed from the second surface 1002 of the remaining portion of the wafer 103. The removing methods for the carrier 101 include laser ablation, chemical dissolution or temperature increase to release the carrier, or any suitable method being familiar to the skilled persons in the art.

Figure 7:
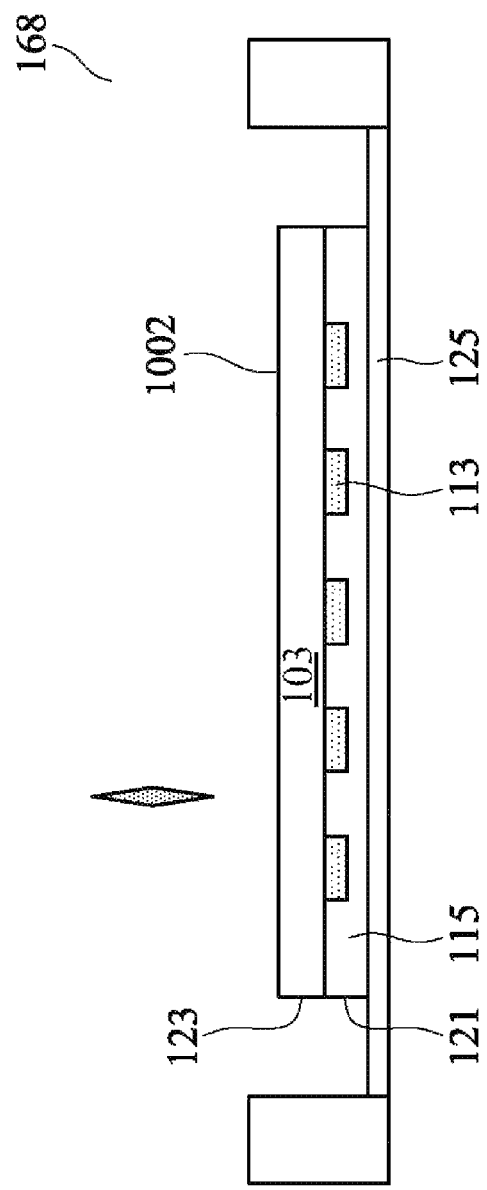
FIG. 7 is a cross-sectional view of a package structure under a singulation process.

FIG. 7 shows a singulation process performed on the package structure 168, which includes the remaining portion of the wafer 103, dies 113, and the encapsulation structure 115. The stacked dies 113 and the semiconductor chips 100 in the package structure 168 are sawed into individual semiconductor components.

FIGS. 8 to 11 depict other embodiments of the present invention. These embodiments illustrated in FIGS. 8 to 11 include the previously described steps shown in FIGS. 1 to 4, wherein like reference numerals refer to like elements.

Figure 8A:
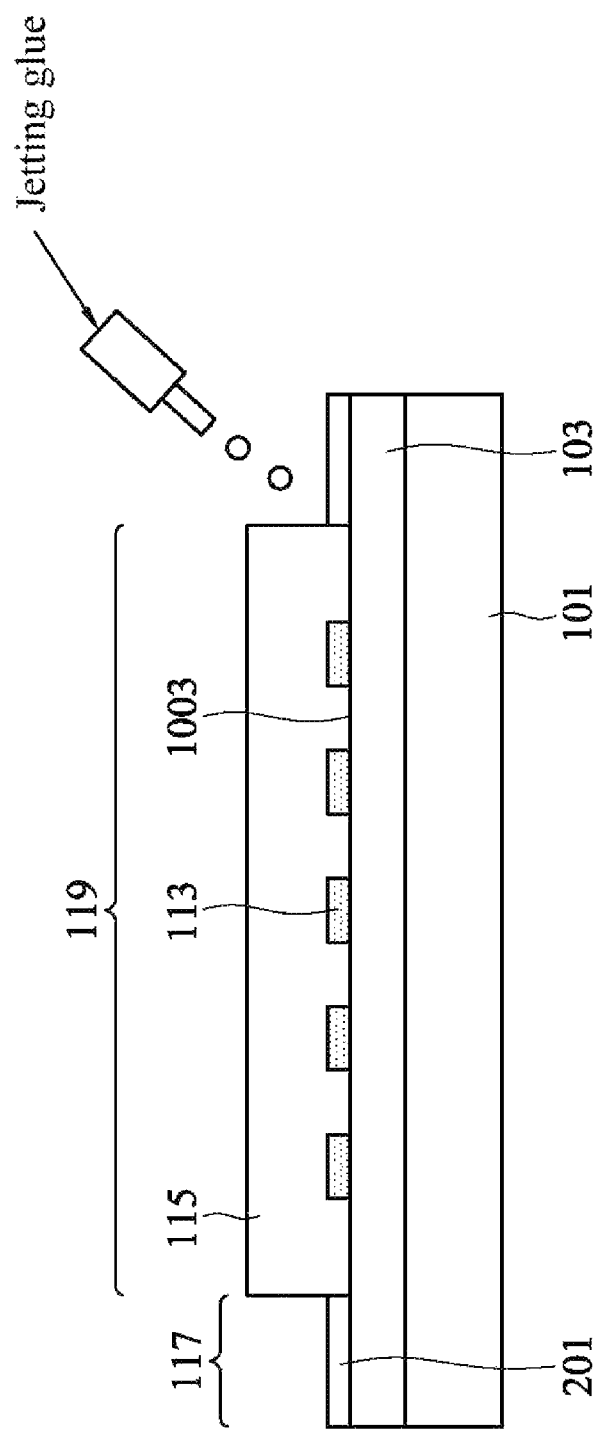
FIG. 8A is a cross-sectional view of a wafer where a protective material is added on the edge portion of the wafer.

FIGS. 8A and 8BI-8BIII illustrate the addition of a protective material 201 to the package structure 168. In one embodiment as shown in FIG. 8A, the protective material 201 is formed by jetting glue with a high viscosity, such as polymer, on the edge portion 117 of wafer 103. In another embodiment shown in FIGS. 8BI-8BIII, the wafer 103 is placed in a mold 205. The mold has a receiving portion for retaining the wafer 103, and the receiving portion has a substantially the same or slightly larger diameter as the wafer 103. The protective material 201 is formed by filing a space 207 defined between the wafer 103, the mold 205, and the encapsulation structure 115 with glue, and then removing any glue on the top surface of the encapsulation structure 115. The glue in the space 207 is leveled with the top surface of the encapsulation structure 115 with a squeegee. In an exemplary embodiment, the protective material 201 is formed of polyimide, PBO, or other high thermal-resist polymer coatings, such as benzocyclobutenes (BCB), SILK™ (Dow chemical), or the like. In some embodiments, the protective material 201 is formed by using the same materials used to underfill semiconductor packages. In another embodiment, the protective material 201 is formed by molding compound including epoxy, silicon based polymer, or any other suitable material.

Figure 9:
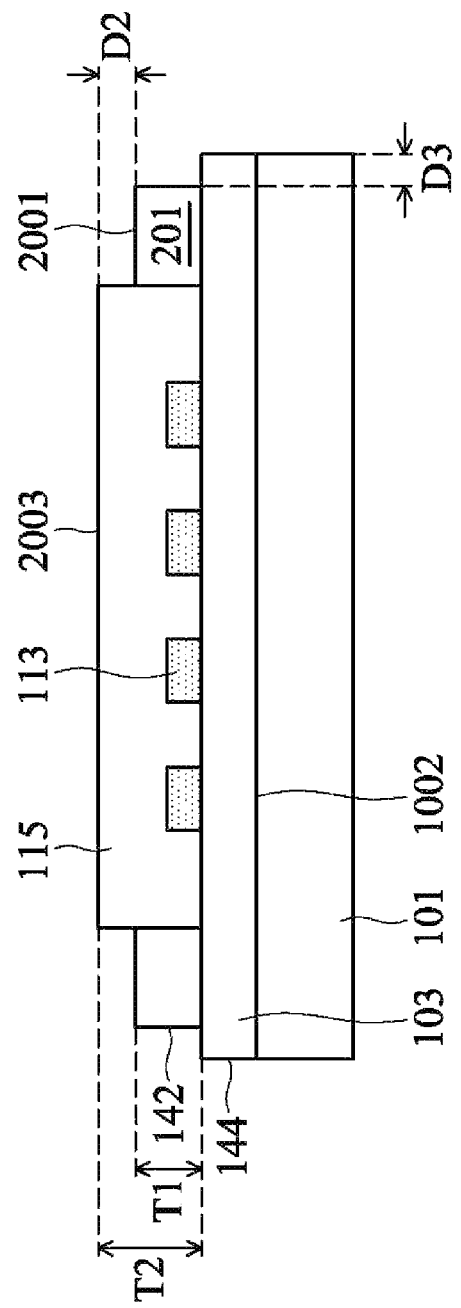
FIG. 9 is a magnified view of the encapsulation structure with the protective material shown in FIGS. 8A and 8BI-8BIII.

FIG. 9 illustrates a more detailed view of the protective material 201 formed over the first surface 1003 of the edge portion 117 of the wafer 103 depicted in FIG. 8A or 8BI-8BIII. In an embodiment, the protective material 201 has a thickness T1 substantially equal to a thickness T2 of the encapsulation structure 115. A top surface 2001 of the protective material 201 and a top surface 2003 of the encapsulation structure 115 are substantially coplanar. In some embodiments, the protective material 201 has the thickness T1 less than the thickness T2 of the encapsulation structure 115. A distance D2 between the top surface 2003 of the encapsulation structure 115 and the top surface 2001 of the protective material 201 is less than 150 µm. In another embodiment, a first sidewall 142 of the protective material 201 and a second sidewall 144 of the wafer 103 are substantial aligned. In some embodiments, a distance D3 between the first sidewall 142 of the protective material 201 and the second sidewall 144 of the wafer 104 is less than 0.5 mm. In other words, the length of the uncovered edge portion 117 is less than 0.5 mm.

Figure 10:
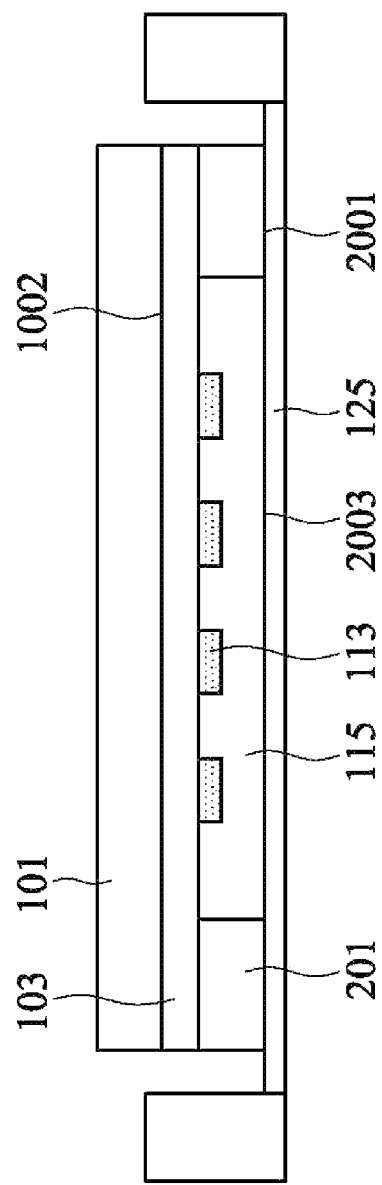
FIG. 10 is a cross-sectional view of the encapsulation structure after it is inverted and the top surface of the encapsulation structure and the protective material is attached to a dicing tape.

Referring now to FIG. 10, the encapsulation structure 115 is inverted, and the top surface 2003 of the encapsulation structure 115 and the top surface 2001 of the protective material 201 are attached to a dicing tape 125. Then, the carrier 101 is removed from the second surface 1002 of the wafer 103. The removing methods for the carrier 101 include laser ablation, chemical dissolution or temperature increase to release the carrier, or any suitable method being familiar to the skilled persons in the art.

Figure 11:
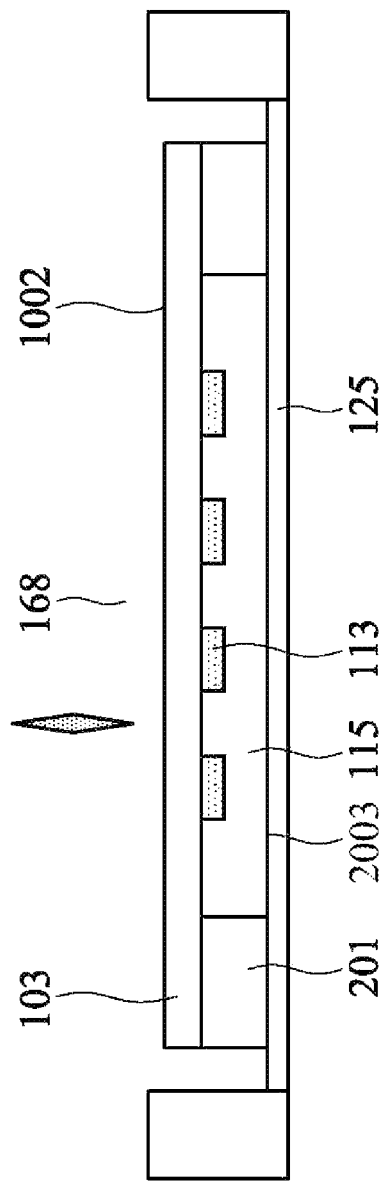
FIG. 11 is a cross-sectional view of a wafer under a singulation process performed on the encapsulation structure and the protective material.

Referring to FIG. 11, a singulation process is performed on the package structure 168, which includes wafer 103, dies 113, the encapsulation structure 115, and the protective material 201. The staked dies 113 and the semiconductor chips 100 on wafer 103 in the package structure 168 are sawed into individual semiconductor components. The protective material 201 provides a rigid support for the edge portion 117 of the wafer 103 during wafer handling and die sawing process. Therefore, crack, peeling, or delamination is less likely to occur in weak layers, such as low dielectric constant layers. The yield of the packing process is thus significantly increased.

Although the embodiments of present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A method of forming a plurality stacked-die package, the method comprising:

providing a wafer having a first surface and a second surface, the wafer comprising a plurality of semiconductor chips on the first surface;

providing a plurality of dies, each of the plurality dies bonded to one of the plurality of semiconductor chips on the first surface;

forming an encapsulation structure over the plurality of dies and the first surface of the wafer, wherein the encapsulation structure covers a central portion of the first surface of the wafer and leaves an edge portion of the wafer exposed; and removing the edge portion of the wafer and leaving a remaining portion of the wafer, wherein a distance between an edge of the encapsulation structure and an edge of the remaining portion of the wafer is less than 0.5 mm.

2. The method of claim 1, further comprising:

attaching second surface of the wafer to a carrier; and thinning the wafer to a predetermined thickness.

3. The method of claim 1, wherein the step of removing the edge portion of the wafer comprises:

completely removing the edge portion of the wafer, wherein the edge of the encapsulation structure and the edge of the remaining portion of the wafer is substantially aligned.

4. The method of claim 1, wherein the step of removing the edge portion of the wafer comprises:

trimming the edge portion of the wafer by a photolithographic/etching process, a laser sawing process, or a mechanical sawing process.

5. The method of claim 1, wherein one of the plurality of the dies is electrically connected to one of the plurality of the semiconductor chips through a through-silicon via (TSV).

6. A method of forming a plurality stacked dies on a wafer, the method comprising:

providing a wafer having a first surface and a second surface, the wafer comprising a plurality of semiconductor chips on the first surface;

bonding a plurality of dies, each onto one of the plurality of semiconductor chips on the first surface;

forming an encapsulation structure over the plurality of dies and a central portion of the wafer on the first surface, whereby the first surface of an edge portion of the wafer is exposed;

covering a protective material over the first surface of the edge portion of the wafer.

7. The method of claim 6, wherein sidewalls of the protective material and the wafer are substantially aligned.

8. The method of claim 6, wherein a distance between sidewalls of the protective material and the wafer is less than 0.5 mm.

9. The method of claim 6, wherein the protective material comprises polyimide, PBO, high thermal-resist polymer, underfill, epoxy, or silicon based polymer.

10. The method of claim 6, wherein a thickness of the encapsulation structure and a thickness of the protective material are substantially the same.

11. The method of claim 6, wherein a distance between a top surface of the encapsulation structure and a top surface of the protective material is less than 150 μm.

12. The method of claim 6, further comprising:

before the step of bonding, attaching a second surface of the wafer to a carrier; and thinning the wafer to a predetermined thickness.

13. The method of claim 12, wherein the step of thinning exposes a through-silicon via (TSV) on the first surface in at least one of the plurality of semiconductor chips.

14. The method of claim 6, wherein one of the plurality of the dies is electrically connected to one of the plurality of the chips through a through-silicon via (TSV).

15. A method of forming a semiconductor component with a stacked die structure, the method comprising:

providing a wafer having a first surface and a second surface, the wafer comprising a plurality of semiconductor chips on the first surface;

bonding a plurality of dies, each onto one of the plurality of semiconductor chips on the first surface, wherein one of the plurality of the dies is electrically connected to one of the plurality of the semiconductor chips through a through-silicon via (TSV);

forming an encapsulation structure over the plurality of dies and a central portion the wafer on the first surface to form a package structure, whereby an edge portion of the wafer is exposed;

forming a protective material over the first surface of the edge portion of the wafer; and sawing the package structure into individual semiconductor components.

16. The method of claim 15, wherein sidewalls of the protective material and the wafer are substantially aligned.

17. The method of claim 15, wherein a distance between sidewalls of the protective material and the wafer is less than 0.5 mm.

18. The method of claim 15, wherein a distance between a top surface of the encapsulation structure and a top surface of the protective material is less than 150 μm.

19. The method of claim 15, wherein the protective material comprises at least one of polyimide, PBO, high thermal-resist polymer, underfill, epoxy, or silicon based polymer.

20. The method of claim 15, wherein the step of forming the protective material comprises:

placing the wafer in a mold, the mold has a receiving portion for retaining the wafer, and the receiving portion has a substantially the same or slightly larger diameter as the wafer; and filling the protective material in a space between the wafer, the mold, and the encapsulation structure.

* * * * *